United States Patent [19]

Meyer

[11] Patent Number: 4,914,376
[45] Date of Patent: Apr. 3, 1990

[54] ACTUATION DEVICE FOR AN ELECTRICAL APPLIANCE

[75] Inventor: Werner Meyer, Schwalbach, Fed. Rep. of Germany

[73] Assignee: Braun Aktiengesellschaft, Kronberg, Fed. Rep. of Germany

[21] Appl. No.: 175,095

[22] Filed: Mar. 30, 1988

[30] Foreign Application Priority Data

Apr. 4, 1987 [DE] Fed. Rep. of Germany ....... 3711484

[51] Int. Cl.⁴ ............................................. G05B 24/02
[52] U.S. Cl. ..................................... 323/352; 323/368; 338/32 R
[58] Field of Search ................ 323/352, 368; 307/116, 307/309; 361/437; 338/32 R, 32 H

[56] References Cited

U.S. PATENT DOCUMENTS

| | | | |
|---|---|---|---|
| 3,366,909 | 1/1968 | Hini et al. | 338/32 R |
| 3,622,922 | 11/1971 | Mogi | 338/32 H |
| 4,578,624 | 3/1986 | Neki et al. | 338/32 R |
| 4,733,214 | 3/1988 | Andersen | 338/32 R |
| 4,812,804 | 3/1989 | Masaki | 338/32 R |

FOREIGN PATENT DOCUMENTS 258595 12/1967 Austria .
354152 4/1977 Austria .
1962087 7/1970 Fed. Rep. of Germany .
2204899 8/1973 Fed. Rep. of Germany .
2848749 5/1980 Fed. Rep. of Germany .
3151879 11/1982 Fed. Rep. of Germany .
3311743 10/1984 Fed. Rep. of Germany .

Primary Examiner—Michael L. Gellner
Assistant Examiner—David M. Gray
Attorney, Agent, or Firm—Fish & Richardson

[57] ABSTRACT

The invention is directed to an actuation device for an electrical appliance, in particular for small electrical appliances such as tooth-brushes, oral jet devices, hair dryers, curling irons, shavers and food processors, for the open- or closed-loop control of at least one operating quantity, including a primary detector for generating controlled variables and a circuit arrangement. The actuation device is characterized in that the primary detector includes a movable element which is arranged at the electrical appliance and produces magnetic or electric fields of varying field strengths in dependence on its position, and further includes an element fixedly disposed on the electrical appliance and sensitive to magnetic or electric fields. The field-sensitive element produces an output quantity which is a measure of the field strength at the site of the field-sensitive element, the output quantity is deliverable to the circuit arrangement, and the circuit arrangement incorporates at least one control function which in turn operates on the operating quantity of the electrical appliance.

16 Claims, 6 Drawing Sheets

FIG.1A
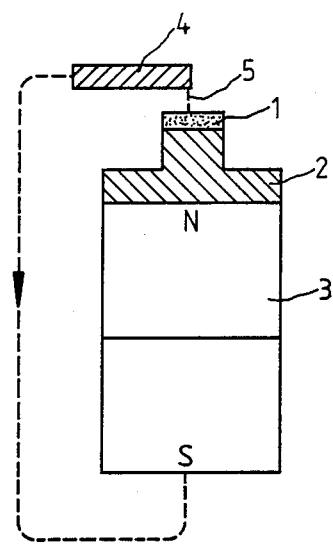
FIG.1B
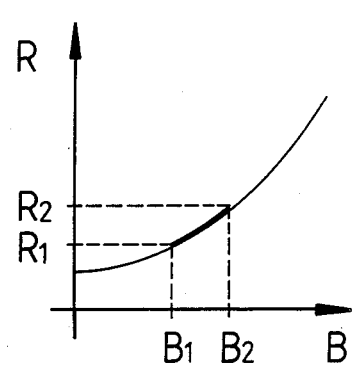
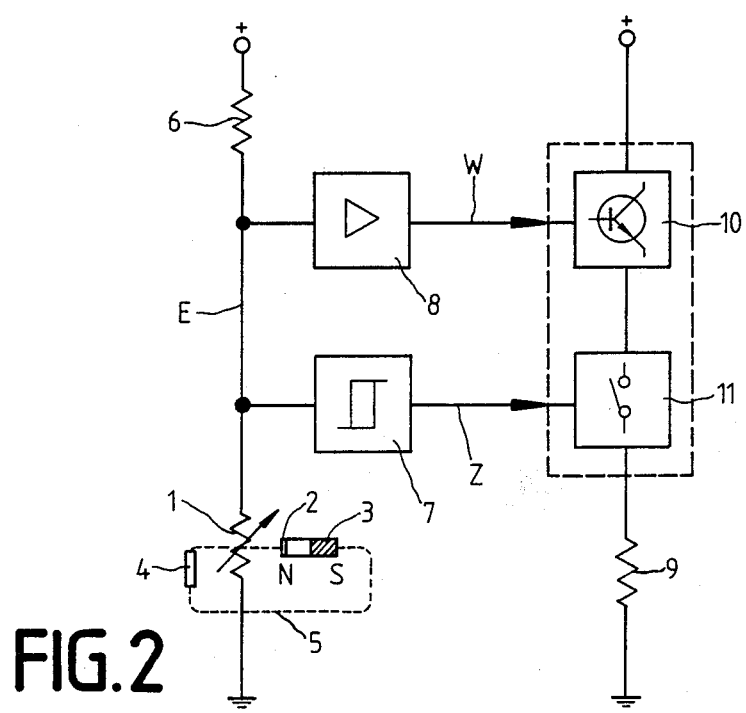
FIG.2

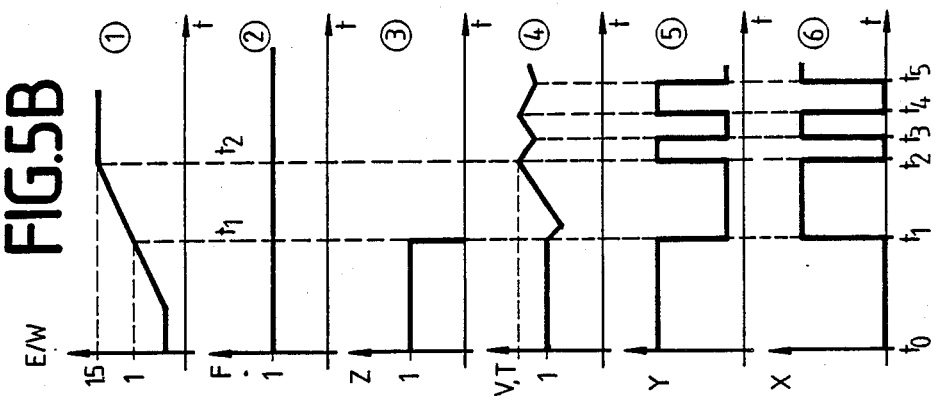
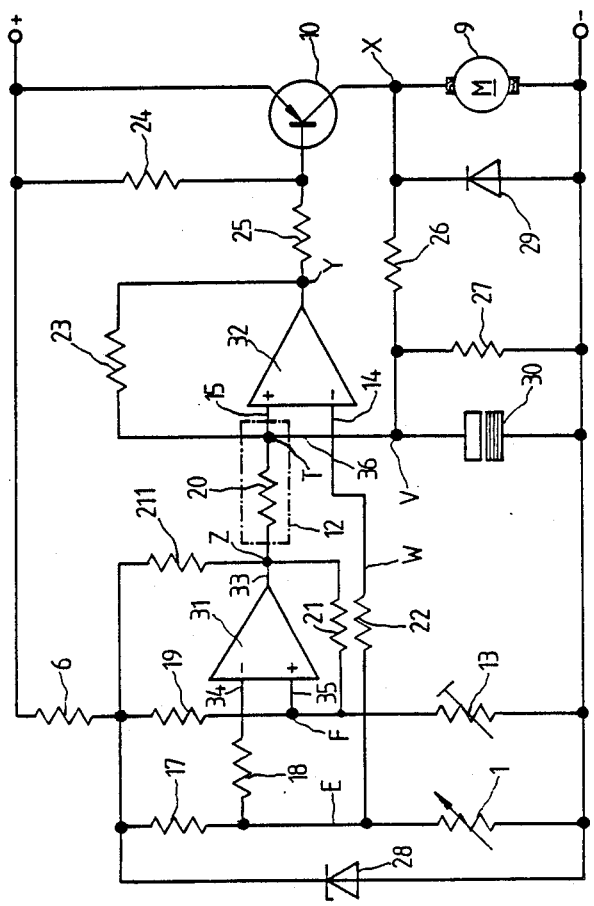

ACTUATION DEVICE FOR AN ELECTRICAL APPLIANCE

To operate electrical appliances, it is frequently necessary to provide an actuation device permitting a variation of at least one operating quantity of the electrical appliance by means of a primary detector and a subsequent circuit arrangement. From DE-OS 2,848,749 an actuation device according to the preamble of the main claim is already known. This actuation device comprises a multi-stage switch and a coil which is part of the transformer of a charging circuitry. For controlling the rotational speed, this coil can be optionally placed in a circuit of a motor of an electric tooth-brush via a tap by means of the multi-stage switch. While this actuation device merely permits predetermined individual rotational speed values to be set, it does not allow a continuous adjustment of the rotational speed. Further, it is rather problematic in practice to realize switches for such uses in tooth-brushes, oral jet devices, electrical household appliances, shavers and the like, because for one thing such switches should be water-proof or water-protected to protect the user of such appliances and to ensure their safe operation, and for another thing moisture or water should be prevented from entering the interior of the housing of the electrical appliance.

It is therefore an object of the present invention to improve upon an actuation device according to the preamble for electrical appliances such that a continuous open- or closed-loop control of at least one operating quantity of the appliance is possible by means of a single movable control device provided on the housing of the electrical appliance. At the same time, high user safety is to be ensured, and the operability of the actuator is not to be impaired by environmental effects such as humidity and contamination.

The means indicated therein enable an operating quantity of the electrical appliance to be adjusted to nearly every possible value using a single movable primary detector. At the same time, high operational and functional reliability is ensured because the need to provide physical connections between the field-influencing or field-producing element and the field-sensitive element is obviated. The field-producing or field-influencing element is capable of being actuated, for example, by a user of the appliance, operating on the field-sensitive element which, for example, is fixedly disposed in the housing of the appliance, without mechanical connections or electrical leads between the two elements being necessary. Nevertheless, the operating quantity of the electrical appliance is largely continuously adjustable or controllable to a high degree of precision by an evaluation of the output quantity of the field-sensitive element.

Because the circuit arrangement incorporates a threshold function and/or a proportional function, the operating quantity of the electrical appliance can be turned on or off while at the same time being set to predetermined values using a single movable element, without the need to provide the movable element with a notching mechanism.

Configuring the movable element as a permanent magnet or yoke of a permanent magnet and the field-sensitive element as a magnetoresistive element affords the advantage of economy of large-scale production and compact construction, because elements configured in this manner are small and relatively inexpensive to manufacture. By arranging the magnetoresistive element and the circuit arrangement in the interior of a housing the electrical appliance and by providing the movable element on the outside of the housing of the electrical appliance, the function of the housing as a means of protection against humidity, contamination and electric voltages becomes fully effective. In addition, dispensing with the need for perforations otherwise necessary for conventional switches or potentiometers, the housing can be manufactured substantially ore easily and economically. Further advantageous embodiments of the circuit arrangement for processing the signals of the primary detector will become apparent from the subclaims in conjunction with the description of the embodiments.

It is particularly advantageous to configure the circuit arrangement as a closed-loop control system for controlling the operating quantity of the electrical appliance. Although the signal for determining the turnon level of the operating quantity of the appliance and the signal referred to for a largely continuous adjustment of the operating quantity are derived from a single output signal, that is, the output signal of the primary detector, the operating quantity is controllable due to the special configuration of the control system indicated in the claims. By configuring the coupling function preferably as a resistor, a very low-cost, but nevertheless effective means of accomplishing the coupling function is provided.

By arranging the field-sensitive element on a pole shoe of a permanent magnet, in which arrangement the flux permeating the field-sensitive element is variable by the movable element, and by configuring the movable element, the pole shoe and the permanent magnet preferably as shell segments situated concentrically about a housing axis, optimum conditions result with regard to the utilization of space and the adaptation of the actuation device to the contours of substantially cylindrical housings of electrical appliances. It proves to be particularly advantageous if the pole shoe is formed as a circular ring section with an adjacent angular section whose foot-shaped free end carries in particular a magnetoresistive element, because the magnetic circuit has only minor magnetically effective resistances such as air gaps and the like, so that the field-sensitive element is always exposed to sufficient field strengths and a satisfactory resolution is ensured. Further advantageous embodiments of the mechanical construction of the primary detector, also for the open- or closed-loop control of more than one operating quantity, will become apparent from the subsequent description of embodiments and from the subclaims.

In the drawings,

FIG. 1A, is a view of a primary detector with a magnetoresistive element;

FIG. 1B is a characteristic wave form of the magnetoresistive element of FIG. 1A;

FIG. 2 is an embodiment of an actuation device;

FIG. 5A is a detailed circuit diagram relating to the electrical schematic of FIG. 4;

FIG. 5B is a graphical representation of pulses to explain the mode of function of the circuitry of FIG. 5A;

Figure 3:
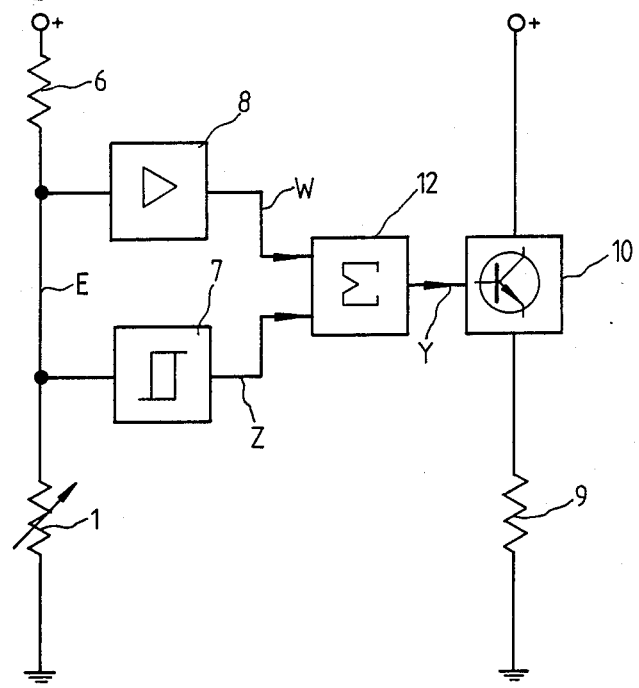
FIG. 3 is an electrical schematic illustrating a first embodiment of a circuit arrangement.

FIG. 1A shows a magnetoresistive element 1 known per se with a pole shoe 2 of soft iron material, a permanent magnet 3 and a movable element 4. The magnetoresistive element on the pole shoe 2 is exposed to the magnetic leakage flux 5 stemming from the permanent magnet 3. By means of the element 4 which is slidable relative to the magnetoresistive element 1, the magnetic leakage flux 5 permeating the magnetoresistive element 1 can be changed. As shown in FIG. 1B, a change in the magnetic induction B permeating the magnetoresistive element 1 effects a change in the resistance R of the magnetoresistive element 1. Thus, a position change of the element 4 is reflected in a change in the resistance of the magnetoresistive element.

FIG. 2 shows an embodiment of an actuation device of an electrical appliance. The primary detector is arranged on a handle or a housing, for example, and includes the components already described with reference to FIG. 1A. In FIG. 2, the magnetoresistive element 1 is illustrated as a variable electric resistor because only this is relevant for the explanation of the circuit arrangement.

Arranged in series with the magnetoresistor 1 is a resistor 6, this series circuit being connected between the two terminals of a DC voltage supply. An electric signal E which is a measure of the resistance of the magnetoresistor 1 and consequently of the position of the movable element 4 is applied to a center tap of this series circuit. Signal E is connected to the inputs of a circuit arrangement comprising a proportional function 8 and a threshold function 7. For the execution of such functions, reference may be had, for example, to the standard reference work "Halbleiter-Schaltungstechnik" b U. Tietze and Ch. Schenk, Springer Verlag Berlin, Heidelberg, New York, 5. Auflage, in particular page 411 ff. and page 688 ff.

An output signal W of the proportional function 8 is supplied to a control function 10 which is connected between the terminals of the voltage supply in series with a switch function 11 and a load 9. The switch function 11 is controlled by the output signals Z of the threshold function 7. Depending on the type of electrical appliance, the load 9 may be, for example, an electric motor, an electric heater or the like, with the operating quantity to be controlled being then understood to mean the rotational speed of the electric motor or the heat output of the electric heater. By means of the control function 10, the output of the load 9 is continuously controllable in dependence on the signal W, while the switch function 11 enables the load 9 to be turned ON or OFF in dependence on the signal Z.

This actuation device thus serves for the adjustment and the ON-OFF control of an operating quantity of an electrical appliance including a primary detector which, for example, is operable by hand. Advantageously, a single movable element 4 is used for controlling the turn-on level of the appliance or the operating quantity and the variation of the operating quantity. It proves to be an advantage that the appliance can be turned off only by setting the operating quantity back to low values. Conversely, the appliance cannot be turned on with the operating quantity at maximum values as, for example, at maximum speed. If the load 9 is, for example, a blower motor or a heating unit of a hair dryer, the circuitry illustrated in FIG. 2 permits the blower or heat output to be readily switched on and varied under finger control, for example.

If the element 4 is positioned in such a manner that the magnetic induction increases, the output voltage (signal E) of the primary detector will also increase. When the turn-on level of the threshold function 7 is reached, the switch function 11 is switched to ON. Further movement of the element 4 causes the signal E to increase further, so that the control function 10 permits an increased supply of power to the load 9. Thus, the operating quantity of the appliance can be set to a higher or lower value by means of the movable element 4, the proportional function 8 and the control function 10. In the process, the switch function 11 remains in the ON state, having no further effect on the power supplied.

If the element 4 is moved back and the turn-off level is reached, the threshold function 7 interrupts via the switch function 11 a further variation of the operating quantity of the electrical appliance, turning the load 9 off. The turn-on operation and the variation of the operating quantity of the electrical appliance can be performed by the user under particularly fine control using, for example, a single finger. The proportional function 8 may be omitted if the output signal E of the primary detector is sufficient to control the control function 10 directly. The turn-on level at which the operating quantity of the electrical appliance is to be varied continuously can be determined by setting the threshold value of the threshold function 7. This eliminates the need for complex mechanical adjustments to determine accurately defined and different turn-on levels, making the circuit arrangement suitable for universal use. In FIG. 2, as in the subsequent FIGS. 3 to 5, the threshold function 7 may be a Schmitt trigger or comparator.

FIG. 3 shows a first embodiment of a circuit arrangement in which parts identical to those of FIG. 2 are assigned identical reference numerals. The primary detector of FIG. 3 is illustrated purely schematically by the resistor of the magnetoresistive element 1.

Unlike the circuit arrangement of FIG. 2, the two output signals W and Z of the amplifier stage 8 and the threshold stage 7, respectively, are fed to a coupling function 12 whose output signal Y controls the control function 10 for the variation and the ON-OFF control of the operating quantity. The control function 10 comprises, for example, a power transistor which controls the supply of current to the load 9 in dependence upon the signal Y at the output of the coupling function 12. The coupling function may be performed, for example, by operational amplifier configured as adder or subtractor or by a diode gate (see also "Halbleiterschaltungstechnik", page 189 ff. and page 147 ff.).

In the embodiment of FIG. 3, a transistor of the control function 10 is used both as a switch and as a continuously acting control element. The circuit arrangement operates as follows: The output signal Y of the coupling function 12 brings the transistor of the control function 10 into conduction whenever the output signal Z of the threshold function 7 assumes values which, due to the specific resistance adjustment of the magnetoresistive element 1, represent the OFF state for the operating quantity to be controlled. This occurs independently of the output quantity W of the proportional function 8 applied to the second input of the coupling function 12. If a change in the resistance of the magnetoresistive element 1 causes the output signal Z to assume values signaling the ON state of the operating quantity, a signal Y proportional to the output signal W of the proportional function 8 will occur at the output of the coupling function 12 and more or less cause the transistor of the control function 10 to switch from the OFF state to the ON state.

Figure 4:
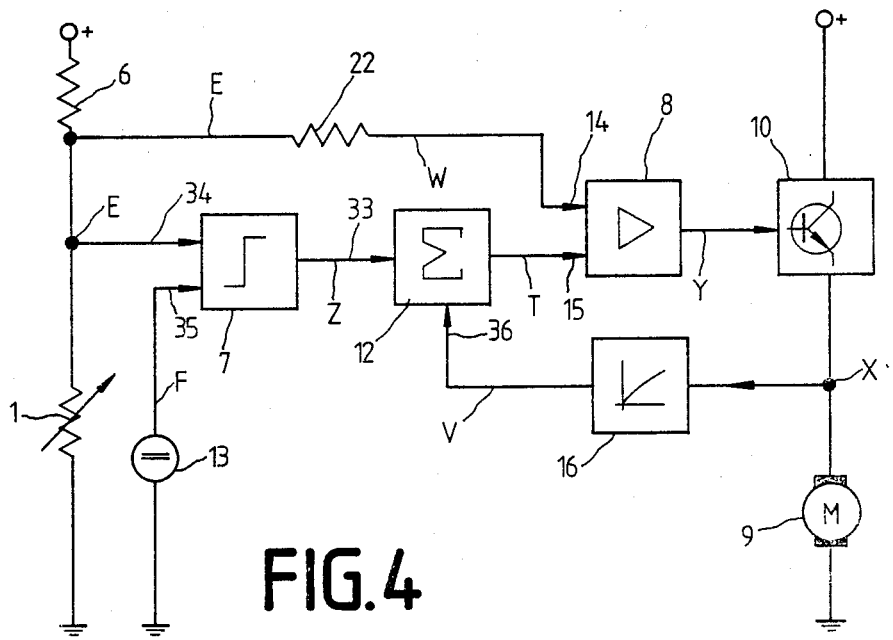
FIG. 4 is an electrical schematic illustrating a second embodiment of a circuit arrangement.

FIG. 4 shows a further embodiment of a circuit arrangement including a closed-loop control system in which parts identical to those of the preceding embodiments are assigned identical reference numerals. The closed-loop control system is formed by the control function 10, a feedback function 16, the coupling function 12 and the proportional function 8. The proportional function 8 has a first input 14 and a second input 15. Via a resistor 22, the proportional function 8 has applied to its first input 14 the signal E present at the center tap of the voltage divider. If resistor 22 is omitted, signal E corresponds to signal W.

For an explanation of the mode of operation of the closed-loop control system, it is assumed first that the coupling function has no effect on the control system and that the signal V at the output of the feedback function 16 is identical wit the signal T at the input of the proportional function 8. The controlled variable X which is a measure of the value of the operating quantity to be controlled as, for example, the rotational speed of a direct-current motor, is applied to the second input 15 of the proportional function 8 via the feedback function 16 which may exhibit a proportional or integral or derivative controller action or a combination thereof. The proportional function 8 performs a comparison between the signal W and the signal T, with the comparison result occurring at the output of the proportional function 8 as signal Y (manipulated variable), operating on the control function 10 correspondingly. This closed-loop control system counteracts fluctuations of, for example, the rotational speed of a direct-current motor or the heat output of a heater, with the position of the movable element 4 of the actuation device determining the reference variable of the operating quantity. In addition to controlling, for example, the blower or heat output of a hair dryer, the embodiments illustrated may also be used for controlling the cutting speed of a dry shaver, the water jet pressure of an oral jet device or the rotational speed of a motor of a food processor.

Considering the action of the threshold function 7 which has not been included in the considerations so far, the following modifications result: If the threshold function 7 signals the ON-state of the operating quantity —this being the case, for example, if the signal E exceeds the value F of a reference signal source 13—, the output of the threshold function 7 provides a signal Z which does not operate on the output signal T of the coupling function 12 so that the function of the closed-loop control system is not affected by signals of the threshold function 7. By contrast, if the movable element 4 is in a position corresponding to the OFF state, the signal level Z occurring at the output of the threshold function 7 causes the transistor of the control function 10 to be turned off. In control engineering terms, the output signal Z of the threshold function 7 may also be interpreted as a disturbance signal applied to the control system, which signal brings the control function 10 into the OFF state reliably and independently of the value of the signal W.

FIG. 5A shows a detailed embodiment of a circuit diagram according to the block diagram of FIG. 4. The threshold function 7 of FIG. 4 includes a first operational amplifier 31 configured as a comparator and having applied to its first input 34 the output signal E of the primary detector via a resistor 18. As already shown, the magnetoresistive element 1 is connected in series with a resistor 17. The center tap between a fixed resistor 13 and a resistor 19 connected in series is connected to a second input 35 of the comparator 31. The resistors 17, 19 are connected to a positive terminal of the voltage supply via a resistor 6. A resistor 21 functioning as a feedback resistor connects an output 33 of the comparator 31 to its input 35. If the comparator 31 has an open collector output 33, a resistor 211 is provided between the output 33 and a junction of the resistors 6, 19. In parallel arrangement with the resistors 17, 1 and 19, 13 is a Zener diode 28 which, in cooperation with resistor 6, stabilizes the voltage. The fixed resistor 13 permits the value of the reference voltage F to be adjusted at the second comparator input 35. The reference voltage F determines the turn-on/turn-off level or the point of transition from which the value of the operating quantity is continuously adjustable. In the preceding embodiment, the amplifier stage 8 is comprised of an operational amplifier 32 having applied to its first input 14 the signal W as reference variable and to its second input 15 the output signal T of the coupling function 12.

The coupling function 12 preferably consists of a single resistor 20 inserted between the output 33 and the input 15. Advantageously, the feedback signal V is superposed on the output signal T of resistor 20 at input 15. The second operational amplifier 32 includes a feedback resistor 23 inserted between the output and the second input 15 and connected to the control function 10 via a resistor 25.

The control function 10 is a p-n-p transistor having its base connected to a positive terminal of the voltage supply via a resistor 24 and to the resistor 25. The emitter of the transistor is directly connected to the positive terminal of the voltage supply. The collector of the transistor is connected to the load 9 which in the present embodiment is a direct-current motor having its second lead connected to a negative terminal of the voltage supply.

The feedback function 16 is provided by a diode 29, resistors 26, 27 and a capacitor 30. The diode 29 connected in parallel with the load 9 keeps the controlled variable (signal X) free of negative direct-voltage components. Via the RC element comprised of resistors 26, 27 and capacitor 30, the output signal V of the feedback function 16 is superposed on the output signal of the coupling function 12 (signal T) and applied to the second input 15. It is also possible to substitute a three-terminal potentiometer for the two-terminal resistor 20, with the signals Z and V being then connected to the leads of the total resistance of the potentiometer and the output (signal T) being provided by the center tap. As operational amplifier, type LM 393 may be used, for example.

The mode of operation of the circuitry illustrated in FIG. 5A will be described in the following. In FIG. 5B, the pulse diagram "1" describes the shape of the output voltage (signal E) of the primary detector or the reference variable (signal W). For reasons of simplicity, output signal E is assumed to change linearly. It is further assumed that the circuitry is in the OFF state and the movable element 4 of the primary detector is in a position in which the magnetoresistive element 1 has a residual resistance. Accordingly, the output signal E in pulse diagram "1" has a low value which is caused by the residual resistance of the magnetoresistive element 1. As the element 4 continues to be moved slowly, the resistance of the magnetoresistive sensing element 1 as well as the output signal E will increase continuously. For the period between $t_0$ and $t_1$ it is assumed that the reference voltage (signal F) is greater than the output signal E. Because signal E assumes values smaller than the reference voltage F until time $t_1$, the maximum output voltage Z resides at output 33. For the period between $t_0$ and $t_1$, the maximum voltage value of signal Z is thus applied to the second input 15, this value being greater than the voltage W at the first input. Consequently, the full operating voltage (signal Y) of the circuit arrangement occurs at the output of the second comparator 32, and the transistor of the control function 10 is non-conducting preventing current flow through the load 9.

At time $t_1$, positioning the movable element 4 correspondingly causes the signal E to exceed the reference signal F, the voltage Z at output 33 dropping to zero value (or, in the event of a bipolar voltage supply, approximately to the value of the negative voltage supply), causing also the resistor 20 of the coupling function 12 to assume this value and to form a parallel circuit with resistor 27.

The voltage at capacitor 30 drops to low values substantially with the time constant resulting from resistors 20, 27 and capacitor 30 (pulse diagram "4"), with the effect of the load 9 on the time constant being neglected in the chart. The voltage drop across capacitor 30 (signal V) produces after a short time the situation that the voltage at the first input 14 assumes again values greater than the voltage at the second input 15 and that the output voltage of the second comparator 32 drops to a low value (pulse diagram "5"; period between $t_1$ and $t_2$). The transistor of the control function 10 becomes conducting causing current to flow through the load 9, the occurrence of a signal X in dependence on the operating quantity (for example, the rotational speed of an electric motor used as the load 9), and the charging of capacitor 30. The voltage at capacitor 30 (signal V) rises again until at time $t_2$ the voltage value predetermined by the movable element 4 is reached.

If the voltage of capacitor 30 (signal V) exceeds the voltage at the first input 14, the output of comparator 32 switches immediately to positive operating voltage values. The transistor turns off and the rotational speed of the motor becomes reduced momentarily. The voltage across capacitor 30 drops until the output of comparator 32 goes again down to low voltage values when at time $t_3$ the voltage of capacitor 30 is again below the voltage value of the signal W at the first input 14 of the second comparator 32.

As shown in the pulse diagrams "4", "5" and "6", control of the rotational speed of the motor is accomplished by turning the motor on and off through varying pulse/no-pulse ratios, the ratio being predetermined by the position of the element 4. Accordingly, in decoupling the control system from the threshold function 7 in the ON state, resistor 20 is assigned an important function in that approximately the potential of the negative terminal of the voltage supply is then applied to output 33. The resistor 20 of the coupling stage 12 preferably has a resistance of 10 kohms. If the voltage value of signal E drops below the value of signal F as a result of a return movement of the control device 4, the voltage at output 33 rises to a maximum value, and the transistor is cut off in the manner previously described.

The circuit arrangement combines with the manually operable primary detector to form an actuating and control system for at least one operating quantity of an electrical appliance. On the other hand, the primary detector represents an interface between a mechanical system and an electrical system, that is, it translates the action of a force exerted, for example, by a finger on the movable element 4 into an electric quantity to be evaluated by the circuit arrangement.

In the following, preferred embodiments of the mechanical construction of the primary detector will be described which cooperate with the circuit arrangement described in a very advantageous manner.

Figure 6:
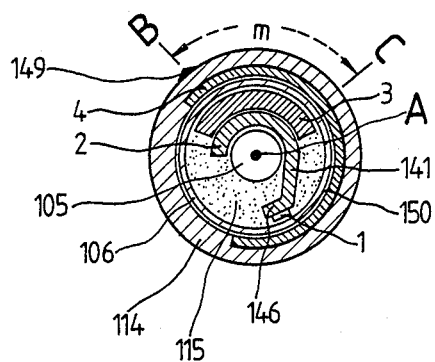
FIG. 6 is a cross sectional view of a primary detector illustrating a first embodiment.

FIG. 6 is a cross-sectional view of a first embodiment of a preferably manually operable primary detector for an electrical appliance of barrel-shaped basic structure. The primary detector serves for the adjustment of at least one operating quantity as, for example, the rotational speed of an electric motor of an electrical appliance. The barrel-shaped electrical appliance may be, for example, an electric tooth-brush or an oral jet device or the like. In the center of the dotted housing shank body 115, a tubular clearance 105 is provided which may serve the function of receiving current- and water-carrying lines, for example. The barrel-shaped housing shank body 115 extends along a longitudinal axis A shown as a dot in a center of the clearance 105.

Embedded in recesses of the housing shank body 115 are the permanent magnet 3 and the pole shoe 2 which is made of a soft iron material. The permanent magnet 3 and the pole shoe 2 are constructed as cylindrical shell segments shown in the Figure as circular-ring sectors layered in serial arrangement.

Formed on a longitudinal edge of the pole shoe 2 is an arm-shaped angular section 141 whose foot-shaped free end 146 carries an element which is sensitive to electric or magnetic fields, detects the position of the movable element 4 and is preferably configured as a magnetoresistive element. The arm-shaped angular section 141 extends approximately radially to the longitudinal axis A, being dimensioned such that the magnetoresistive element 1 is arranged at the edge of the housing shank body 115.

The foot-shaped free end 146 terminates in an area of the housing shank body 115 which lies approximately opposite the permanent magnet 3 and is not occupied by the magnet. The position of the adjacent magnetoresistive element 1 has been chosen such that it is in the operating range of the element 4 which is equally constructed as cylindrical shell segment, is embedded in a cylindrical control sleeve 114 and rotatable therewith about the longitudinal axis A.

The element 4 which is a soft iron material or a permanent magnet is capable of being turned together with the cylindrical control sleeve 114 within the range of the arc or actuating travel "m" between points B and C, with the individual positions being indicated by a mark 149. The length of the arc and the position of the magnetoresistive element are so dimensioned that the magnetoresistive element 1 is overlapped by the element 4 irrespective of whether the mark 149 is at end position B or C. The cylindrical shell segments of the pole shoe 2 of the permanent magnet 3 and the element 4 with the cylindrical control sleeve 114 are conformed to the housing contour or housing curvature of the electrical appliance, with the pole shoe 2 forming the innermost shell segment, the permanent magnet 3 the middle shell segment and the element 4 the outermost shell segment.

The stationary parts (115, 1, 2, 141, 146, 3) may be referred to as inner parts which are adapted to be hermetically sealed to environmental effects by a sealing layer as, for example, a housing 106 of the electrical appliance. The sealing layer or the housing 106 prevents water and moisture from entering and ensures a safe function of the inner components including the circuit arrangement, in addition to protecting the user from electrical hazards. A small air gap 150 is formed between the inner and outer parts which permits the cylindrical control sleeve 114 to slide on the housing 106 in a clearance-free and sensitive manner.

The mode of operation of the control device of the invention consists in that the leakage flux 5 (see FIG. 1) originating from the permanent magnet 3 is changed by the element 4. As described in the foregoing, the magnetoresistive element 1 is arranged in the overlap area of the one longitudinal edge of the element 4. On the other hand, the permanent magnet 3 is in the overlap area of the other longitudinal edge of the element 4. As best seen in FIG. 6, the major part of the permanent magnet 3 is overlapped by the cylindrical control sleeve 114 in the position shown, with the mark 149 being at point B. Turning the cylindrical control sleeve 114 clockwise causes the mark 149 to move over to point C together with the element 4. As the sleeve is turned further, the amount of overlap between the element 4 and the permanent magnet 3 becomes progressively smaller.

Magnetization of the permanent magnet 3 is preferably in a radial direction so that the path of the magnetic circuit of the magnetic induction produced by the permanent magnet 3 is as follows: The magnetic flux lines of the leakage flux extend from the upper side of the permanent magnet 3 to the element 4, preferably travelling through the element 4 due to the high permeability of the material. At the other free end of the element 4, the flux lines enter the foot-shaped end 146 of the pole shoe 2 via the magnetoresistive element 1. The flux lines subsequently travel from the angular section 141 to the shell-shaped pole shoe 2 and onwards to the permanent magnet 3. In order to keep the magnetic resistances low, the sealing layer or the housing 106 as well as the air gap 150 between the permanent magnet 3 and the element 4 and the spacing between the element 4 and the magnetoresistive element 1 are to be maintained as small as possible. Equally, it is desirable to have the inside of the permanent magnet 3 in clearance-free abutment with the outside of the pole shoe 2.

Due to the varying overlap area between the element 4 and the permanent magnet 3, the magnetic induction changes in dependence on the relative position of the element 4 to the permanent magnet 3. Correspondingly, a greater or smaller leakage flux 5 permeates the magnetoresistive element 1. If the mark 149 is at stop point B, the magnetic flux flowing through the magnetoresistive element 1 is high because the amount of overlap between the element 4 and the permanent magnet 3 is likewise high. Conversely, the leakage flux 5 through the magnetoresistive element 1 is at a minimum if the mark 149 is at stop point C. It is the property of the magnetoresistive element 1 that its resistance varies in dependence upon the flux permeating it. This change in resistance is utilized by the previously described evaluating circuitry for controlling an operating quantity of the electrical appliance. By means of the cylindrical control sleeve 114 it is thus possible, for example, to control the motor speed of an electric tooth-brush continuously between the maximum speed at point B and the minimum speed at point C. Depending on the configuration of the evaluating circuitry, the maximum motor speed may also be at point C.

The primary detector of FIG. 6 permits a continuous variation of the operating quantity of an electrical appliance by turning the cylindrical control sleeve 114 about the longitudinal axis A. The embodiment described may, however, be modified such that a variation of the operating quantity is accomplished solely by displacing the cylindrical control sleeve 114 parallel to the longitudinal axis A. For this purpose, it is necessary to vary the leakage flux, i.e. the amount of overlap between the element 4 and the permanent magnet 3, by displacement alongside of the longitudinal axis A.

Advantageously, the primary detector can be modified in such a manner that the cylindrical control sleeve 114 accommodates merely the magnetoresistive element 1 and the pole shoe 2 with the angular section 141 and its foot-shaped free end 146, whilst the permanent magnet 3 forms the movable element 4 which is embedded in the cylindrical control sleeve 114.

In a further advantageous embodiment requiring a minimum of components, the movable element 4 is a permanent magnet having a magnetic field gradient over its extent in the direction of rotation. In this event, the pole shoe 2 may even be omitted, merely the magnetoresistive element 1 has to be arranged in the interior of the housing of the appliance. A turning movement of an element 4 constructed in this manner produces for each setting a different flux permeating the magnetoresistive element 1, so that over varying settings of the movable element 4 varying resistances of the magnetoresistive element 1 are adjustable and an open- or closed-loop control of an operating quantity of the electrical appliance is possible in the manner already described.

With reference to FIG. 6, a primary detector has been described which permits a variation of one operating quantity. It is, however, possible to construct the primary detector using two magnetoresistive elements such as to allow a variation of two operating quantities of the electrical appliance, in which event flux variations could be accomplished by a displacement of a first movable element 4 in the direction of the longitudinal axis A and by a turning movement of a second movable element 4 about the longitudinal axis A, with the two magnetoresistive elements being appropriately arranged. There is, however, the risk of the two fluxes affecting each other adversely in such a manner as to prevent an independent variation of the two operating quantities.

Figure 7:
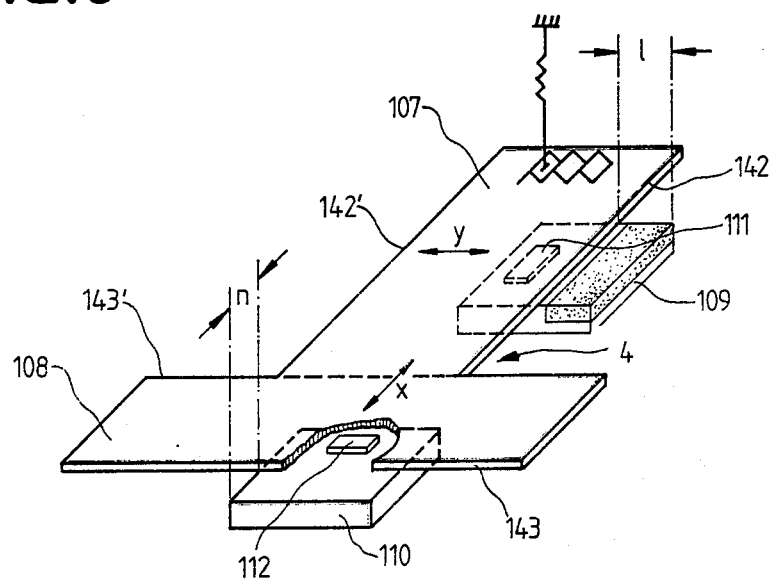
FIG. 7 is a schematic perspective view of a primary detector illustrating a second embodiment.

FIG. 7 illustrates a further embodiment of the primary detector by means of which two operating quantities of the electrical appliance are adjustable reliably and independently of one another. The movable element 4 of the plane primary detector has a T-shaped basic structure including a longitudinal section 107 and a transversal section 108. The longitudinal section 107 possesses two longitudinal edges 142 and 142' and the transversal section 108 possesses two transverse edges 143 and 143', with the transverse edge 143' blending into the longitudinal edges 142, 142' in the area of transition to the longitudinal section 107. A permanent magnet and pole shoe unit 109 is arranged in the area of the longitudinal edge 142 of the longitudinal section 107. The field-sensitive elements used are identified by magnetoresistive elements 111 and 112, with the permanent magnet and pole shoe unit 109 carrying the magnetoresistive element 111. In the same manner, a second permanent magnet and pole shoe unit 110 carrying the second magnetoresistive element 112 is provided in the area of the transverse edge 143 of the transversal section of the control device 4. In the permanent magnet and pole shoe unit 109, the permanent magnet is marked with dots.

The arrangement of the sensing units at different edges of the element 4 and the T-shaped structure of the element 4 prevent the two leakage fluxes from affecting each other adversely. While a displacement of the movable element 4 in the direction Y changes the magnetic flux permeating the magnetoresistive element 111, a displacement in the direction X causes a change in the magnetic flux permeating the magnetoresistive element 112. The advantage of the primary detector described consists in that the amount of overlap between, for example, the movable element 4 in the area of the transverse edge 143 and the permanent magnet and pole shoe unit 110 is not changed when the element 4 is moved in the direction Y. The same applies conversely when the element 4 is moved in the direction X. For example, if the longitudinal section 107 includes notches indicated schematically which extend longitudinally in parallel arrangement to each other and to the longitudinal edge 142, the element 4 can be notched in the direction Y, with a spring urging a locking lever into the respective notch. On the other hand, the control device 4 is displaceable continuously in direction X. Thus, the second operating quantity which is variable by means of the magnetoresistive element 112 is also mechanically adjustable continuously and independently of the first operating quantity which is determined by the first magnetoresistive element 111 and the notch selected. Where necessary, it is also possible to provide notches for direction X, these notches then extending at right angles to the notches associated with direction Y.

The movable element 4 is made of a single piece of sheet metal of T-shaped structure. With the advantages described in the foregoing being maintained, it is, however, also possible to provide the element 4 with an L-shaped structure or to manufacture the T- or L-shaped basic structure of two separately made parts forming the longitudinal section 107 and the transversal section 108 by riveting both parts together in an overlapping fashion, for example. Where applicable, it is also advantageous to connect the longitudinal section 107 with the transversal section 108 through a magnetically inactive insulating member whereby the magnetic decoupling between the two leakage fluxes is additionally increased. Another embodiment further provides a second transversal section 108 at the free end of the longitudinal section 107 so that the element 4 is of an H-shaped basic structure. Moreover, the remaining free edges of the longitudinal or transversal sections 107, 108 may be provided with further magnetoresistive elements with permanent magnet and pole shoe units, to be suitably connected to the magnetoresistive elements 111, 112 to augment the sensitivity of the primary detector. Whilst a primary detector responsive to magnetic flux variations is described in the embodiments, it is within the scope of the invention to use capacitive primary detectors which are responsive to electric field changes. In particular it is possible to employ other sensor principles together with the movable element 4—including, for example, Hall probes or sensors responsive to alternating electromagnetic fields such as oscillatory circuits.

Figure 8:
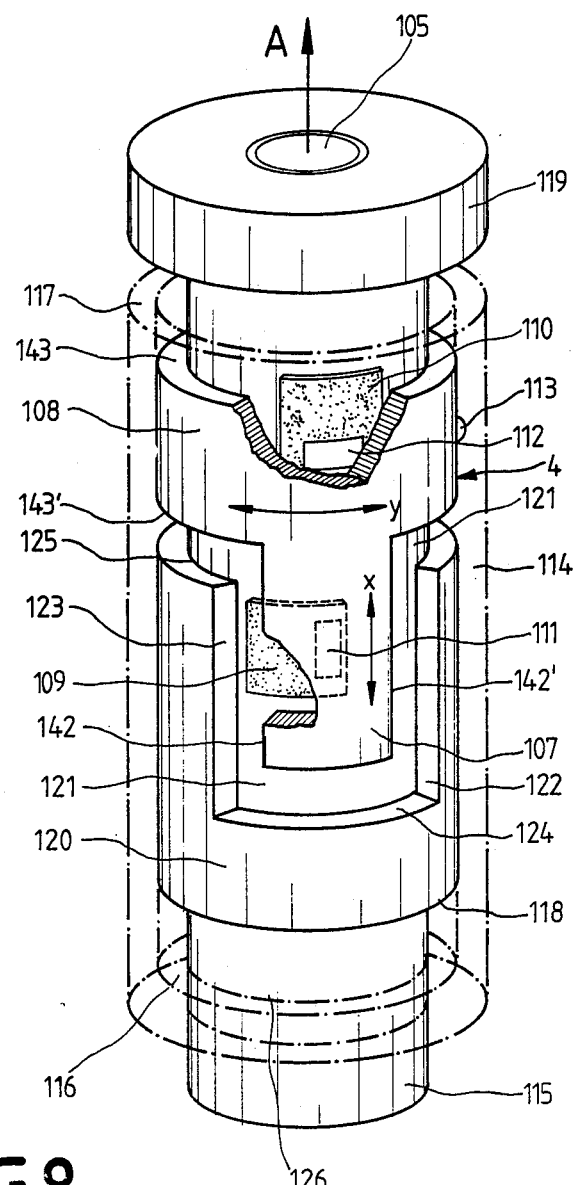
FIG. 8 is a perspective view of a primary detector of round basic shape illustrating a third embodiment.

FIG. 8 illustrates in perspective view another embodiment of a primary detector in which a reliable mechanical guide is provided for the movable element 4. The transversal section 108 is curved about the longitudinal axis A of the barrel-shaped housing shank body in the manner of a ring, with the longitudinal section 107 extending parallel to the longitudinal axis A. In this embodiment, the longitudinal section 107 has the extent of its width equally conformed to the surface curvature of the housing shank body 115. This permits easy adjustment of the element 4 conformed to the surface curvature of the housing shank body 115 in direction Y by rotating movement and in direction X by longitudinally sliding movement. The housing shank body 115 thus contributes substantially to the mechanical guiding of the control device 4, with the annular clamping effect provided by the transversal section 108 alone being already sufficient to securely fasten the element 4 to the housing shank body 115. If the cylindrical control sleeve 114 is equally constructed as a ring, shown in dot-and-dash lines, extending around the full circumference of the housing shank 115, it is not necessary for the transversal section 108 to extend beyond half the surface of the housing shank body 115 to provide a safe mounting. The element 4 is thus slidable and rotatable relative to the housing shank body 115 in conjunction with the cylindrical control sleeve 114, with a projection 113 provided on the element 4, for example, being suitable to contribute to a safe anchoring of the cylindrical control sleeve 114 with the element 4. The axis of rotation of the element 4 or the cylindrical control sleeve 114 is coincident with the longitudinal axis A of the housing shank body 115. The advantage of the mechanical guiding by conforming the element 4 to the curvature of the surface of the housing shank body 115 is, however, also achievable in other appliances having, for example, a broad handle and a radiused forward edge. In this event, the axis of rotation of the control device 4 does not coincide with the longitudinal axis of the housing shank body, and the cylindrical control sleeve 114 is not a closed ring but a cylinder segment. Such an embodiment of the control device of the invention incorporating a cylindrical control sleeve in the form of a cylindrical shell segment may be accommodated, for example, in the handle of a hair dryer having no round housing shank body 115. The housing shank body 115 includes an upper portion 119 which, for example, is seated on the housing shank body 115 after the element 4 is slipped thereon, serving as an abutment stop for the upper stop edge 117 of the cylindrical control sleeve 114 and the transverse edge 143 of the annular transversal section 108. In addition, the housing shank body 115 includes a stop sleeve 120 with a recess 121 for receiving the longitudinal section 107 and with stop edges 118, 122 to 125. The recess 121 provides at the same time a field of motion for the longitudinal section 107 of the element 4. The inside diameter of the cylindrical control sleeve 114 corresponds to the outside diameter of the stop sleeve 120, with the cylindrical control sleeve 114, for example, being slipped on the primary detector from below to be subsequently connected with the element 4. Preferably, the outside diameter of the stop sleeve 120 is identical to the ring diameter of the transversal section 108. The longitudinal movement of the cylindrical control sleeve 114 is limited, for example, in the direction of the longitudinal axis A by the stop edges 116, 118 and 117, the upper portion 119, and the edges 143 and 125. The rotary leftward movement of the element 4 is limited by the stop edge 123 of the recess 121 and by the longitudinal edge 142, its movement towards the right being limited by the stop edge 122 of the recess 121 and the longitudinal edge 142' of the longitudinal section 107 which projects into the recess 121 in pin-like fashion. The permanent magnet and pole shoe units 109, 110 with their respective magnetoresistive elements 111, 112 are arranged in suitable recesses in the housing shank body 115. For example, the electrical leads to the magnetoresistive elements 111, 112 may run in the tubular clearance 105 of the housing shank body 115. Further, in a highly advantageous embodiment the interior of the housing shank body 115 including the magnetoresistive elements 111, 112 may be sealed against the ingress of moisture and liquid by means of the closed sealing layer 106 or housing shown in FIG. 6. To this end, the sealing layer 106 not shown in FIG. 8 has to be suitably conformed to the contours of the recess 121 and the stop sleeve 120. The small air gap 150 necessary for ease of movement of the cylindrical control sleeve 115 is not shown in FIG. 8.

Cooperating with the cylindrical control sleeve 114, the element 4 is freely adjustable within the predetermined degree of freedom within the field of motion. This field of motion is bounded by the stop edges previously described. It permits adjustment of the first operating quantity of the electrical appliance by a linear movement in the direction X, i.e., in the direction of the longitudinal axis A, and of the second operating quantity by a rotary movement in the direction Y, i.e., about the longitudinal axis A. It is understood that suitable notching means may be provided permitting the element 4 to be notched in the direction X or Y. In the majority of applications, however, it proves to be particularly advantageous to provide a notchless control. This enables the element 4 to be moved with a high degree of sensitivity along any path within the field of motion bounded by the stop edges, with the open- or closed-loop control of the two variable operating quantities being accomplished without any physical connection with the housing interior. For adjustment of the operating quantities it is only necessary to overcome the friction between the stationary and the movable parts. If the control device of FIG. 8 is used, for example, in an electric tooth-brush permitting at the same time water to be supplied through the brush head, the rotary motion of the tooth-brush may be varied, for example, by rotating the cylindrical control sleeve while the water supply is variable by linear movement. Equally, it is possible to use the actuation device or the primary detector in a hair dryer, for example, in which the rotary motion controls the heat output while the linear motion adjusts the air flow rate to desired values. This enables the user of an electrical appliance so equipped to readily vary as desired two operating quantities of the appliance simultaneously by hand, while still permitting the housing of the appliance to be hermetically sealed and protected against the ingress of water or dust.

Figure 9:
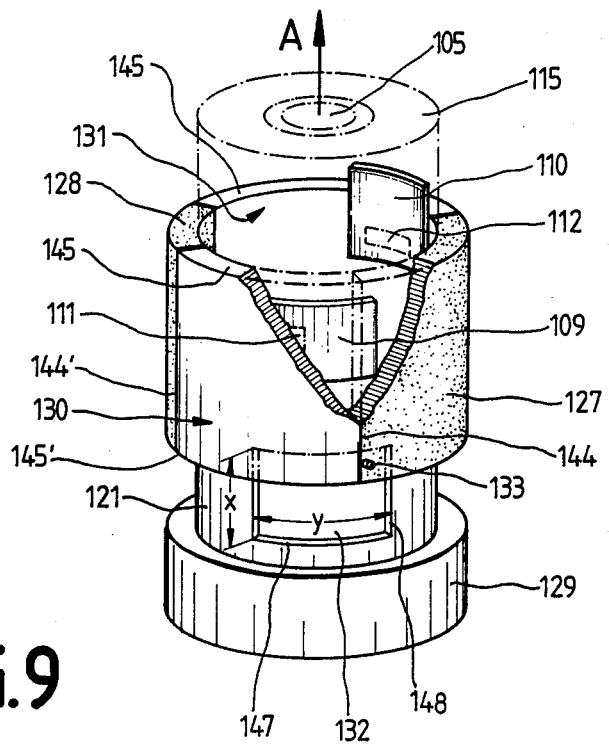
FIG. 9 is a perspective view of a primary detector of round basic shape illustrating a fourth embodiment.

FIG. 9 shows a further embodiment of a primary detector for varying two operating quantities. In contrast to the embodiment of FIG. 8, the primary detector includes two separate movable elements in the form of cylindrical shell sections 130, 131 which are combined to form a ring by means of two magnetically inactive insulating members 127, 128. For better distinction, the insulating members 127, 128 are marked with dots. A lower portion 129 is arranged in the bottom area of the housing shank body 115. A field of motion is identified by reference numeral 132, forming a recess in the shape of a cylindrical shell in the housing shank body 115. The longitudinal movement of the cylindrical shell sections 130, 131 is limited in direction X by the stop edges 147, and the rotary movement in direction Y is limited by the stop edges 148, with the stop edges contacting a stop pin 133 which extends into the field of motion 132 and is secured in the insulating member 127. It is to be understood that the stop pin 133 may also be provided at any other suitable location. The ring which is composed of the two magnetically active cylindrical shell sections 130, 131 and the two magnetically inactive insulating members 127, 128 is thus adjustable by rotary or linear movement in accordance with the size of the field of motion 132.

Two permanent magnet and pole shoe units 109, 110 are provided for variation of the two operating quantities. The magnetoresistive element 111 and the permanent magnet and pole shoe unit 109 associated therewith are arranged on the lateral longitudinal edge 144 of the cylindrical shell section 130. The second magnetoresistive element 112 and the permanent magnet and pole shoe unit 110 associated therewith are arranged in the area of the annular edge 145 of the second cylindrical shell section 131. The two insulating members 127, 128 prevent the two leakage fluxes for the first and second magnetoresistive element 110, 111 from adversely affecting each other. Unlike the embodiment shown in FIG. 9, it may be considered an advantage to arrange the two magnetically active cylindrical shell sections 130, 131 with the associated sensing units 109 to 112 at different locations on the periphery of the control device. In this event it is possible, for example, to arrange the two cylindrical shell sections 130, 131 alongside of the longitudinal axis A in a spaced relationship.

It is also within the scope of the present invention to provide other embodiments of the two separate cylindrical shell sections 130, 131 in which the cylindrical shell sections 130, 131 are not combined with the insulating members 127, 128 to form a ring. The control device shown in FIG. 9 thus affords a plurality of application possibilities in housing shank bodies of a large variety of forms.

Figure 10:
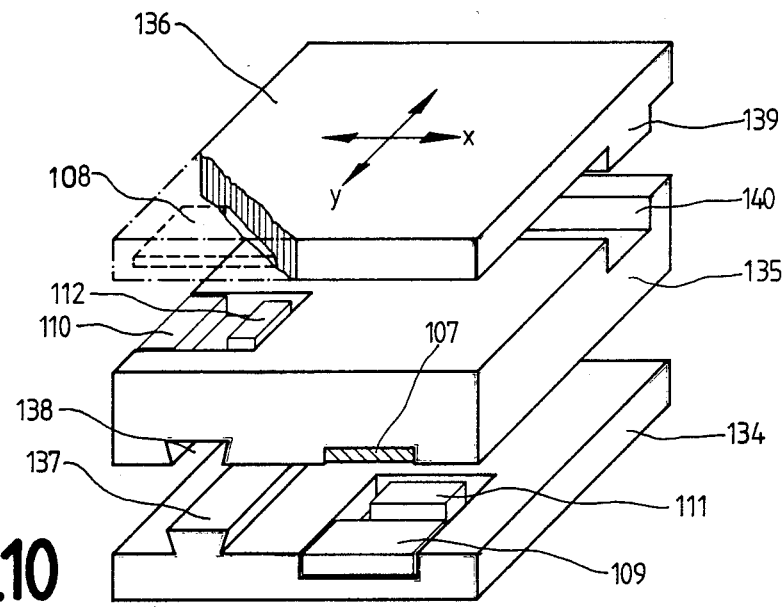
FIG. 10 is a perspective view of a primary detector of plane basic shape illustrating a fifth embodiment.

FIG. 10 illustrates a last embodiment of a primary detector in which an upper sliding plate 136, an intermediate plate 135 and a lower sliding plate 134 are arranged vertically on one another. To guide the individual sliding plates mechanically, a tongue-and-groove guide 139, 140 is provided connecting the upper sliding plate 136 and the intermediate plate 135, permitting movement of the upper sliding plate 136 relative to the intermediate plate 135 in direction X. Further, another tongue-and-groove guide 137, 138 is provided connecting the intermediate plate 135 and the lower sliding plate 134, this guide extending vertically to the tongue-and-groove guide 139, 140. The tongue-and-groove guide 137, 138 permits sliding motion of the intermediate plate 135 together with the upper sliding plate 139 in direction Y, if it is assumed that, for example, the lower sliding plate 134 is fixedly connected with the electrical appliance or its housing shank body. In contrast to the upper tongue-and-groove guide 139, 140, the lower tongue-and-groove guide 137, 138 is a dovetail guide which advantageously prevents the intermediate plate 135 from lifting clear of the lower sliding plate 134 as is possible between the upper sliding plate 139 and the intermediate plate 135. Because the tongue-and-groove guides 139, 140 and 137, 138 extend at right angles to one another, the position of the upper sliding plate 139 relative to the intermediate plate 135 is advantageously variable in direction X without the position of the intermediate plate 135 relative to the lower sliding plate 134 changing. Nor is the position of the upper sliding plate 139 relative to the intermediate plate 135 variable if the intermediate plate 135 is displaced relative to the lower sliding plate 134 in direction Y.

The intermediate plate 135 and the upper sliding plate 139 accommodate soft magnetic elements comparable with the longitudinal section 107 and the transversal section 108 previously described. Arranged on the lower sliding plate 134 are the permanent magnet and pole shoe unit 109 and a first magnetoresistive element 111 which cooperate with the longitudinal section 107 in the manner previously described and are not illustrated in greater detail. Equally, the intermediate plate 135 accommodates the second magnetoresistive element 112 and the associated permanent magnet and pole shoe unit 110 which cooperate with the transversal section 108 in the upper sliding plate 139. In this arrangement, it is irrelevant whether the sections 107, 108 are arranged in the intermediate plate 135 or in the sliding plates 134, 136 or in the manner illustrated. It is only essential that the two primary detectors be arranged in two different edge areas which extend and are relatively slidable at right angles to each other. Only if these conditions are fulfilled is it ensured that the amounts of overlap previously described are variable by sections 107, 108 in accordance with directions X and Y.

In the embodiment illustrated in FIG. 10, there is no appreciable danger of the magnetic leakage fluxes of the two sensing units adversely affecting each other, because the control action substantially originates from the edges of sections 107, 108. It is, however, also possible to provide a magnetic shield in the intermediate layer 135 which prevents the two leakage fluxes from adversely affecting each other. The sliding plates 134, 136 and the intermediate plate 135 are preferably of plastics material or of a non-ferromagnetic material. The embodiment shown in FIG. 10 is suitable for use in a shaving apparatus, for example, in which case one sensing unit suffices for one direction if, for example, only the cutting speed is to be changed. The embodiment shown in FIG. 10 is equally suitable for use in stand-type electrical appliances in which case the actuation device may be provided on a plane surface of the appliance. It is, however, also advantageous to curve the plates 134, 135 and 136 on the arc of a circle in order to conform them to the curved contour of a handle of the appliance. For this purpose, the three plates 134, 135 and 136 are likewise shell-shaped and arranged vertically on one another, with the one tongue-and-groove guide extending parallel to the imaginary axis of rotation while the other tongue-and-groove guide extends about the imaginary axis of rotation on the arc of a circle.

Whilst in the embodiments described the movable elements are to be made of a soft magnetic material, it is also possible to use permanent magnets for the movable elements themselves. Further, all embodiments permit the sealing layer to be provided in lieu of or in combination with the housing. Still further, the field of motion may be triangular, for example. Also, the use of a capacitive sensing unit in lieu of the inductive sensing unit described is advantageous for a variety of applications in which the element 4 may be shaped in L-, T- or H-form.

I claim:

1. An actuation device for an electrical appliance for the open- or closed-loop control of at least one operating quantity of the electrical appliance, including an appliance housing, a primary detector for the generation of controlled variables, said primary detector including a movable magnetic field varying element which is arranged on the outside of said appliance housing and produces magnetic fields of varying field strengths in dependence on its position, and an element fixedly disposed on the electrical appliance and sensitive to magnetic fields, said field-sensitive element being disposed inside said housing including a magnetoresistive element and being adapted to produce an output quantity which is a measure of the field strength at the site of said field-sensitive element, a circuit arrangement inside said housing, and means for delivering said output quantity to said circuit arrangement, said circuit arrangement incorporating at least one control function responsive to said output quantity which in turn operates on the operating quantity of the electrical appliance.

2. An actuation device for an electrical appliance for the open- or closed-loop circuit of at least one operating quantity of the electrical appliance, including a primary detector for the generation of controlled variables said primary detector including a movable element which is arranged at the electrical appliance and varies magnetic field strength in dependence on its position, and an element fixedly disposed on the electrical appliance and sensitive to magnetic fields, said field-sensitive element being adapted to produce an output quantity which is a measure of the field strength at the site of said field-sensitive element, a circuit arrangement, means for delivering said output quantity to said circuit arrangement, said circuit arrangement incorporating a threshold function (7) and a proportional function (8), said circuit arrangement providing as a first output signal (Z) an ON-OFF signal for said operating quantity, said proportional function (8) providing as a second output signal (W) a reference variable or manipulated variable of said operating quantity, and control circuitry coupled to said circuit arrangement for adjusting said operating quantity in accordance with said output signals (Z, W).

3. An actuation device as claimed in claim 2 wherein said control circuitry incorporates a control function (10) to which said second output signal (W) is applied and a switch function (11) to which said first output signal (Z) is applied.

4. An actuation device as claimed in claim 3, wherein said control function (10) and said switch function (11) are connected in series.

5. An actuation device as claimed in claim 2, wherein said output signal (Z) and said output signal (W) are applied to a control function (10) as input signals.

6. An actuation device as claimed in claim 2 wherein said control circuitry includes a control function (10) and a feedback function (16) that are connected in series with said proportional function (8) and provide a controller, with an output signal (Y) of said proportional function (8) being deliverable to said control function (10), the output signal (Z) of said threshold function (7) being coupled to an output signal (V) of said feedback function (16), and the coupled signal (T) being applied to said proportional function (8) in addition to an output signal (E) of said primary detector.

7. An actuation device as claimed in claim 6 and further including means for applying said output signal (E) of said primary detector and a reference signal (F) to said threshold function (7).

8. An actuation device as claimed in either claim 6 or 7 and further including a coupling function (12) that has a first input adapted to receive said output signal (Z) and a second input adapted to receive an output signal (V) of said feedback function (16).

9. An actuation device as claimed in claim 1 wherein said field-sensitive element of said primary detector includes a permanent magnet (3) and said magnetoresistive element which translates a flux (5) of said permanent magnet (3) permeating it into an output signal (E) of said primary detector with the flux (5) detected by the said magnetoresistive element being variable by said movable element that (4).

10. An actuation device for an electrical appliance for the open- or closed-loop control of at least one operating quantity of the electrical appliance, including a primary detector for the generation of controlled variables, said primary detector including a movable outer element which varies magnetic field strengths in dependence on its position, and an inner element sealed to environmental effects by a sealing layer impervious to liquid or humidity and fixedly disposed on the electrical appliance and sensitive to magnetic fields, said field-sensitive element including a magnetoresistive element arranged on a pole shoe of a permanent magnet, said movable magnet being adapted to vary the flux permeating the magnetoresistive element, said movable element, said pole shoe and said permanent magnet substantially being in the form of shell segments arranged concentrically about an axis (A), said magnetoresistive element being adapted to produce an output quantity which is a measure of the field strength at the site of said magnetoresistive element, a circuit arrangement, and means for delivering said output quantity to said circuit arrangement, said circuit arrangement incorporating at least one control function responsive to said output quantity which in turn operates on the operating quantity of the electrical appliance.

11. An actuation device as claimed in claim 10 wherein said pole shoe and said permanent magnet are embedded in a barrel-shaped housing shank body and said movable element is in an outer cylindrical control sleeve.

12. An actuation device as claimed in claim 11 wherein said housing shank body includes stop edges bounding a field of motion for said movable element (4).

13. An actuation device as claimed in claim 10 wherein said pole shoe (2) has an angular section at the free end of which said magnetoresistive element is provided.

14. An actuation device as claimed in claim 9 wherein said movable element comprises an intermediate plate connected on its underside to a lower sliding plate carrying a first magnetoresistive element through a first interlocking means, being further connecting on its upper side to an upper sliding plate carrying a second magnetoresistive element through a second interlocking means, the two said interlocking means extending at right angles to each other.

15. An actuation device as claimed in any one of the claims 9 or 10 suitable for use with one or several types of small electrical appliances referred to in the following: tooth-brushes, oral jet devices, hair dryers, curling irons, shaves, food processors including juice extractors, blenders, choppers.

16. An actuation device as claimed in claim 1 wherein said movable element includes permanent magnet element has a magnetic field strength gradiant over its extent in the direction of its movement relative to said fixed field-sensitive element.

* * * * *